US010020031B2

(12) United States Patent
Chong et al.

(10) Patent No.: US 10,020,031 B2
(45) Date of Patent: Jul. 10, 2018

(54) LOCATION-BASED OPTIMIZATION FOR MEMORY SYSTEMS

(71) Applicant: ARM Limited, Cambridge (GB)

(72) Inventors: Yew Keong Chong, Austin, TX (US); Andy Wangkun Chen, Austin, TX (US); Sriram Thyagarajan, Austin, TX (US); Gus Yeung, Austin, TX (US); James Dennis Dodrill, Dripping Springs, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/401,588

(22) Filed: Jan. 9, 2017

(65) Prior Publication Data

US 2017/0117022 A1    Apr. 27, 2017

Related U.S. Application Data

(63) Continuation-in-part of application No. 14/849,902, filed on Sep. 10, 2015, now Pat. No. 9,542,986.

(60) Provisional application No. 62/164,810, filed on May 21, 2015.

(51) Int. Cl.
| | |
|---|---|
| *G11C 8/18* | (2006.01) |
| *G11C 7/10* | (2006.01) |
| *G11C 29/50* | (2006.01) |
| *G11C 5/14* | (2006.01) |
| *G11C 8/06* | (2006.01) |
| *G11C 29/02* | (2006.01) |
| *G11C 29/00* | (2006.01) |

(52) U.S. Cl.
CPC ............ *G11C 7/1012* (2013.01); *G11C 5/141* (2013.01); *G11C 8/06* (2013.01); *G11C 8/18* (2013.01); *G11C 29/022* (2013.01); *G11C 29/023* (2013.01); *G11C 29/025* (2013.01); *G11C 29/028* (2013.01); *G11C 29/50012* (2013.01); *G11C 29/702* (2013.01)

(58) Field of Classification Search
CPC ......... G11C 7/065; G11C 11/419; G11C 8/06; G11C 8/18
USPC .................................. 365/154, 233.5, 230.08
See application file for complete search history.

(56) References Cited

U.S. PATENT DOCUMENTS

| | | | | | |
|---|---|---|---|---|---|
| 4,344,170 | A | * | 8/1982 | Arita ...................... | H04Q 11/04 370/366 |
| 4,412,323 | A | * | 10/1983 | Abbott ..................... | H04J 3/14 370/217 |
| 4,601,028 | A | * | 7/1986 | Huffman ................... | H04J 3/14 370/217 |
| 4,993,013 | A | * | 2/1991 | Shinada .................... | H04J 3/14 370/242 |
| 5,014,261 | A | * | 5/1991 | Shinbashi ................. | H04J 3/14 370/220 |
| 5,058,104 | A | * | 10/1991 | Yonehara .................. | H04J 3/14 370/242 |

(Continued)

*Primary Examiner* — Michael Tran
(74) *Attorney, Agent, or Firm* — Pramudji Law Group PLLC; Ari Pramudji

(57) ABSTRACT

Various implementations described herein are directed to a method of integrated circuit design and fabrication. In the implementation of a memory integrated circuit, the floorplan of the integrated circuit comprises memory blocks, where instantiations of the memory blocks are optimized to satisfy timing specifications while minimizing power consumption or not significantly contributing to leakage current.

17 Claims, 8 Drawing Sheets

(56) References Cited

U.S. PATENT DOCUMENTS

| | | | |
|---|---|---|---|
| 5,530,378 A * | 6/1996 | Kucharewski, Jr. | H03K 19/1737 326/39 |
| 5,841,785 A * | 11/1998 | Suzuki | G11C 29/56 324/762.01 |
| 6,724,669 B1 * | 4/2004 | Bhatia | G11C 29/846 365/189.02 |
| 6,798,740 B1 * | 9/2004 | Senevirathne | H04L 1/20 370/219 |
| 2003/0016578 A1 * | 1/2003 | Janik | G11C 29/26 365/201 |
| 2004/0008547 A1 * | 1/2004 | Kwon | G11C 7/1051 365/193 |
| 2004/0114446 A1 * | 6/2004 | Takahashi | G11C 11/4087 365/222 |
| 2010/0180150 A1 * | 7/2010 | Jeddeloh | G06F 11/073 714/5.1 |
| 2012/0129301 A1 * | 5/2012 | Or-Bach | G11C 8/16 438/129 |
| 2013/0173865 A1 * | 7/2013 | Wu | G06F 9/30098 711/149 |
| 2013/0212431 A1 * | 8/2013 | Ong | G06F 15/167 714/15 |
| 2013/0315055 A1 * | 11/2013 | Nakano | H04L 1/0003 370/225 |
| 2014/0082453 A1 * | 3/2014 | Sikdar | G11C 29/808 714/763 |
| 2014/0157065 A1 * | 6/2014 | Ong | G11C 29/12 714/718 |
| 2014/0211551 A1 * | 7/2014 | Kim | G11C 29/4401 365/158 |
| 2015/0076923 A1 * | 3/2015 | Frankel | B81B 7/008 307/113 |
| 2015/0325314 A1 * | 11/2015 | Ziaja | G11C 29/12 365/189.02 |
| 2015/0348594 A1 * | 12/2015 | Patel | G11C 5/02 365/49.1 |

* cited by examiner

LOCATION-BASED OPTIMIZATION FOR MEMORY SYSTEMS

PRIORITY CLAIM

This application is a continuation-in-part of U.S. patent application Ser. No. 14/849,902, filed Sep. 10, 2015 and to be issued on Jan. 10, 2017 as U.S. Pat. No. 9,542,986, which claims the benefit of and priority to U.S. provisional application Ser. No. 62/164,810, filed May 21, 2015, the disclosures of which are incorporated herein by reference.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits typically include circuitry to perform data access functions to assist with memory operations. However, even when disabled or in standby, some of these data access functions may parasitically consume power. For instance, a significant portion of total dynamic power may be consumed due to toggling of control input pins of memory when disabled or in standby. As such, there exists a need to reduce control input pin power consumed when disabled or in standby.

In addition to reducing power consumption at the control input pins, the choice of memory architecture and the type of components or circuit blocks making up a memory can reduce power consumption, but the architecture or components should be properly chosen to satisfy timing constraints.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations as described herein refer to and are directed to low power input gating circuitry for providing improved power, performance, and area (PPA) by reducing pin power to the control inputs of memory. Further, various implementations described herein refer to and are directed to introducing a low power feature configured to gate-off latches to reduce control input pin power of memory so as to improve PPA.

Various implementations of low power input gating will now be described in more detail with reference to FIGS. 1-5.

Figure 1:
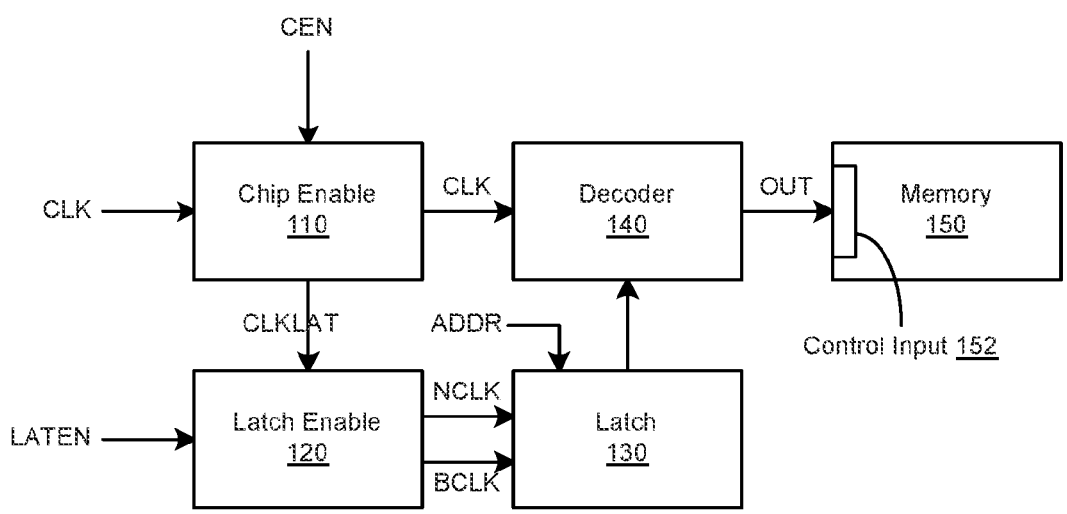
FIG. 1 illustrates a diagram of low power input gating circuitry in accordance with various implementations described herein.

FIG. 1 illustrates a block diagram of low power input gating circuitry 100 in accordance with various implementations described herein. As shown in FIG. 1, low power input gating circuitry 100 may be implemented as an integrated circuit with multiple stages. In some implementations, the multiple stages may be referred to as sub-divided circuit portions, components, or devices with interdependent relationships. For instance, low power input gating circuitry 100 may include a chip enable device 110, a latch enable device 120, a latch device 130, a decoder device 140, and a memory device 150. As will be described in greater detail herein, these devices 110, 120, 130, 140, 150 may be used separately or as integrated circuit portions with interdependent relationships.

The chip enable device 110 may be configured to receive and use a clock input signal CLK to toggle a control input 152 of the memory device 150 based on a chip enable signal CEN, which may also be referred to as a Common Enable signal. After passing through logical processing in the chip enable device 110, the clock input signal CLK may be passed from the chip enable device 110 to the latch enable device 120 and also passed to the decoder device 140. The latch enable device 120 may be configured to receive the CLK signal from the chip enable device 110 and then pass one or more other CLK signals, such as, e.g., NCLK, BLCK, to the latch device 130 based on a latch enable signal LATEN. Further, the decoder device 140 may be configured to receive the CLK signal from the chip enable device 110 and then pass an output signal OUT based on the CLK signal to the control input 152 of the memory device 150.

The latch device 130 may be configured to latch the control input 152 of the memory device 150. As described herein, the clock input signal CLK may be passed from the chip enable device 110 to the latch enable device 120. Further, the latch enable device 120 may receive the CLK signal and pass the NCLK signal and the BCLK signal to the latch device 130. Further, the latch device 130 may be configured to receive the NCLK and BCLK signals along with an address bus signal ADDR and then provide a latch signal LAT to the decoder device 140. The latch device 130 may be coupled to an address bus (not shown), and the latch device 130 may be configured to receive the address bus signal ADDR via the address bus. In various implementations, the address bus may be coupled to an external device or circuit, such as, e.g., external memory. Further, the latch device 130 may include a low phase latch device. Further, in various implementations, the address bus may refer to any bus or control bus configured to provide a control signal, and input gating may be used for any other signal in addition to the address bus. As such, the latch device 130 may be coupled to any bus, and the latch device 130 may thus be configured to receive any control signal via any bus.

As shown, the latch enable device 120 may be coupled between the chip enable device 110 and the latch device 130. Further, the latch enable device 120 may be configured to receive the clock input signal CLK from the chip enable device 110. The latch enable device 120 may be configured to use the clock input signal CLK to gate the latch device 130 based on the latch enable signal LATEN so as to selectively cutoff toggling of the clock input signal CLK (as the output signal OUT) to the control input 152 of the memory device 150. In some implementations, the latch enable device 120 may be configured to provide low power input gating to the latch device 130 by using the latch enable signal LATEN to selectively cutoff toggling of the clock input signal CLK (as output signal OUT) to the control input 152 of the memory device 150.

As shown, the decoder device 140 may be coupled to the chip enable device 110, the latch device 130, and the memory device 150. The decoder device 140 may be configured to receive the clock input signal CLK from the chip enable device 110, receive the latch signal LAT from the latch device 130, and provide the output signal OUT to the control input 152 of the memory device 150 based on the chip enable signal CEN provided to the chip enable device 110 and based on the latch enable signal LATEN provided to the latch enable device 120. These and other functional operations of the decoder device 140 will be described in greater detail herein below.

The memory device 150 may comprise any relevant memory device having the control input 152. In some implementations, the memory device 150 may include random access memory (RAM), such as, e.g., static RAM (SRAM).

Figure 2:
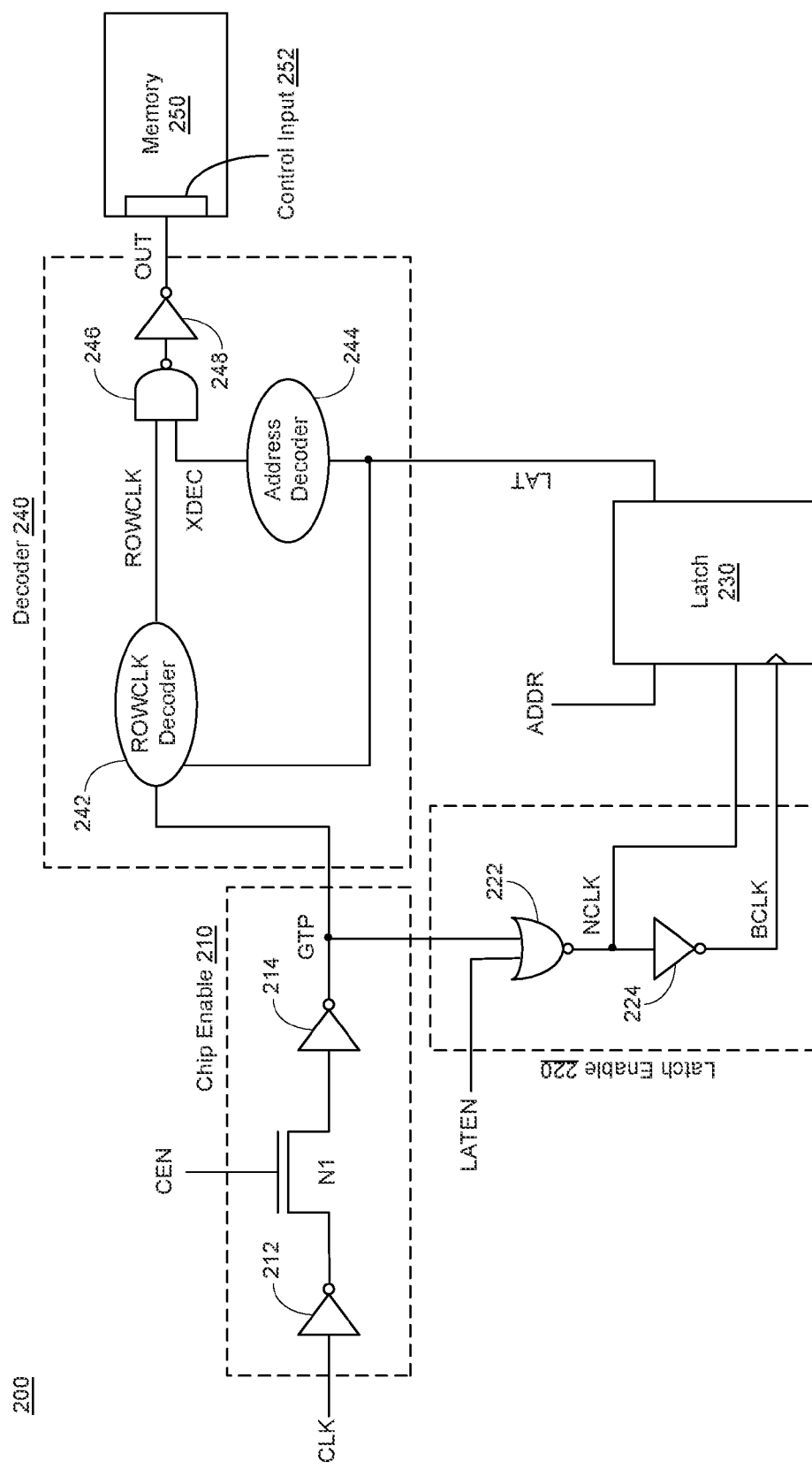
FIG. 2 illustrates a schematic diagram of a low power input gating circuit in accordance with various implementations described herein.

FIG. 2 illustrates a schematic diagram of a low power input gating circuit 200 in accordance with various implementations described herein. As shown in FIG. 2, the low power input gating circuit 200 may be implemented with multiple stages that may be referred to as sub-divided circuit portions, components, or devices with interdependent relationships. For instance, low power input gating circuit 200 may include a chip enable device 210, a latch enable device 222, a latch device 230, a decoder device 240, and a memory device 250. These devices 210, 222, 230, 240, 250 may be similar to respective devices 110, 120, 130, 140, 150 of FIG. 2. Further, as described in greater detail herein, these devices 210, 222, 230, 240, 250 may be used separately or as integrated circuit portions with interdependent relationships.

The chip enable device or circuit 210 may include a first logic device N1 coupled to a clock input path, and the logic device N1 may be configured to receive the clock input signal CLK via the clock input path. In some implementations, the logic device N1 may include, e.g., an N-type Metal-Oxide-Semiconductor (NMOS) transistor N1. As shown in FIG. 2, NMOS transistor N1 may be disposed between first and second inverters 212, 214. The first inverter 212 may be configured to receive and invert the clock input signal CLK and then provide the inverted clock input signal ($\overline{CLK}$) to the NMOS transistor N1. As shown, the NMOS transistor N1 may be configured to pass the inverted clock input signal ($\overline{CLK}$) to second inverter 214 based on chip enable signal CEN. The second inverter 214 may be configured to receive and invert the inverted clock input signal ($\overline{CLK}$) and provide the clock input signal CLK to node GTP, which may refer to a node for implementing a Global Tracking Pulse (GTP). Generally, Global Tracking Pulse (GTP) may refer to an internal memory clock signal. Further, the clock input signal CLK may then be passed to the latch enable device 220 and the decoder device 240.

The latch enable device or circuit 220 may include a first logic device 222 and a second logic device 224. As shown in FIG. 2, the first logic device 222 may include a NOR gate configured to receive the clock input signal CLK from the chip enable device 210 via the node GTP. The first logic device 222 (i.e., NOR gate) may also be configured to receive the latch enable signal LATEN from an external device or circuit. Further, based on latch enable signal LATEN, first logic device 222 (i.e., NOR gate) may be configured to provide the CLK signal as a first output clock signal NCLK to second logic device 224 and also to latch device 230. Further, the second logic device 224 may include an inverter configured to receive the first output clock signal NCLK from the first logic device 222 (i.e., NOR gate) and provide a second output clock signal BCLK to the latch device 230. The second output clock signal BCLK may be an inverse or a compliment (or $\overline{NCLK}$) of the first clock input signal NCLK.

In some implementations, the LATEN signal may be an active low signal that may be used to clock gate the address pins of the latch device 230. For instance, when the LATEN signal is 0 (LATEN=0), the latch device 230 may be configured in a normal active mode. Further, when the LATEN signal is 1 (LATEN=1), the BCLK signal may be forced to 1, and the latch device 230 may be configured in a standby mode (or chip-disable mode). This mode may be used for input latch blocking to avoid or at least inhibit any toggling of the control input 252 of the memory device 252 after the latch. Further, the latch device 230 may be referred to as a PH2 Latch, and when BLCK is 0 (BLCK=0), the PH2 Latch may be or become transparent.

In some implementations, the first and second logic devices 222, 224 may be configured to provide low power input gating to latch device 230 by using the latch enable signal LATEN to selectively cutoff toggling of clock input signal CLK to the control input 252 of memory device 250. For instance, the first and second logic devices 222, 224 of the latch enable device 220 may be arranged and configured to use the clock input signal CLK received from the chip enable device 210 to gate the latch device 230 based on the latch enable signal LATEN so as to selectively cutoff the clock input signal CLK to the control input 252 of the memory 250. In some cases, the first logic device 222 is coupled to the chip enable device 210, and as such, the first logic device 222 is configured to receive the clock input signal CLK via the chip enable device 210 based on the chip enable signal LATEN. Further, in some cases, the second logic device 224 is coupled to the chip enable device 210 via the first logic device 222, and as such, the second logic device 224 may be configured to receive the clock input signal CLK from the chip enable device 210 via the first logic device 222 based on the chip enable signal LATEN.

The latch device 230 may be configured to latch the control input 252 of the memory device 250 based on the first clock output signal NCLK, the second clock output signal BCLK, and/or the latch enable signal LATEN. As described herein above, the latch enable signal LATEN may be used to control output of the first output clock signal NCLK to the latch device 230. In some implementations, the latch device 230 may receive the NCLK and BCLK signals along with an address bus signal ADDR and then provide a latch signal LAT to the decoder device 240 based on one or more of these signals NCLK, BCLK, and/or ADDR. Further, latch device 230 may be coupled to an address bus (not shown), and the latch device 230 may be configured to receive the address bus signal ADDR via the address bus. In some implementations, as described herein above, the latch device 230 may implemented with a low phase latch device.

The decoder device 240 may be coupled to chip enable device 210, latch device 230, and memory device 250. The decoder device 240 may be configured to receive the clock input signal CLK from the chip enable device 210 and receive the latch signal LAT from the latch device 230. Further, the decoder device 240 may be configured to provide the output signal OUT to the control input 252 of the memory device 250 based on the chip enable signal CEN provided to the chip enable device 210 and/or based on the latch enable signal LATEN provided to the latch enable device 220.

In some implementations, as shown in FIG. 2, the decoder device 240 may include a first decoder 242 (e.g., a ROW-CLK decoder) and a second decoder 244 (e.g., an address decoder). Further, the decoder device 240 may include one or more logic devices including, e.g., a first logic device 246 that may be implemented as a NAND gate and a second logic device 248 that may be implemented as an inverter. The first decoder 242 may be configured to receive the clock input signal CLK from the chip enable device 210, receive the LAT signal from the latch device 230, and provide a first signal (e.g., ROWCLK, such as Row Decoder signal, i.e., decoder output clock) to the first logic gate 246 (i.e., NAND gate). The second decoder 244 may be configured to receive the LAT signal from latch device 230 and provide an XDEC signal (i.e., X Decoder signal) to the first logic device 246 (i.e., NAND gate). The first logic device 246 (i.e., NAND gate) may be configured to receive the ROWCLK signal from the first decoder 242, receive the XDEC signal from the second decoder 244, and provide a first output signal to the second logic device 248 (i.e., inverter). The LAT signal may refer to a latched_addr signal, which may refer to a bus split into different bits, and a few bits may be used to decode ROWCLK. Other bits may be used to decode XDEC. In some cases, the LATEN signal is the same as ECEN. Further, the second logic device 248 (i.e., inverter) may be configured to receive the first output signal from the first logic device 246 (i.e., NAND gate), invert the received first output signal, and provide a second output signal (i.e., the output signal OUT) to the control input 252 of the memory device 250.

In various implementations, a significant portion of total dynamic power may be consumed due to toggling of control inputs of memory in chip-disable mode. For instance, control input pin power in chip-disable mode may account for up to approximately 8% of total power in memory. As such, the techniques described herein may be used to reduce pin power in standby mode (i.e., chip-disable mode). For instance, techniques described herein may be used to reduce pin power in standby mode to less than approximately one-tenth of a same pin power in active mode.

With the low power input gating feature described herein, an ECEN (Early CEN) signal may be added to gate the latches of control inputs to reduce power consumption inside the memory due to the toggling of control inputs. In some cases, as described herein, the LATEN signal may be the same as the ECEN signal. Further, in some cases, this ECEN signal may be used to gate the latches for the following inputs: Address (ADDR), Global Write Enable (GWEN), Left Right Enable (LREN), and Extra Margin Adjustment (EMA). Further, the ECEN signal may not be used to gate D or WEN latches, due to implementation constraints. However, this idea may be applies to all control pins.

As described in reference to FIG. 2, the CEN signal may be used to control GTP (Global Tracking Pulse) and WL (Wordline) headers. In some cases, the CEN signal may be used to gate the power supply (not shown) to the second logic device 248 (i.e., inverter) of the decoder device 240. With the addition of the ECEN signal, the following design changes may be introduced: the CEN signal may be used to control GTP, and the ECEN signal may be used to control WL headers and latch enables. Further explanation of these signals along with other related signals is provided herein below in reference to FIG. 3 and Tables 1 and 2.

Figure 3:
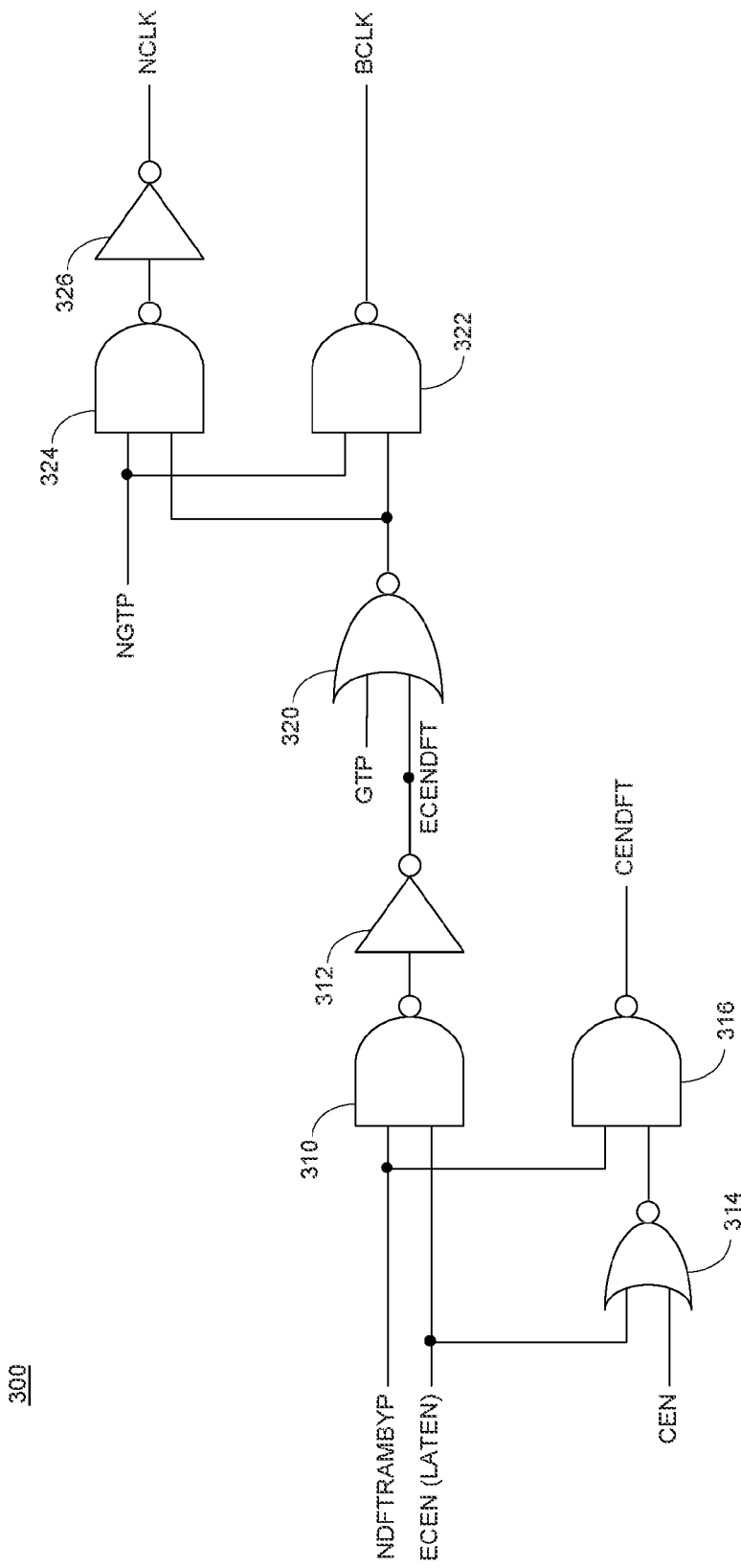
FIG. 3 illustrates a schematic diagram of latch enable circuitry in accordance with various implementations described herein.

FIG. 3 illustrates a diagram of latch enable circuitry 300 in accordance with various implementations described herein. In particular, the latch enable circuitry 300 of FIG. 3 is an alternate implementation of the latch enable circuitry 220 of FIG. 2. As shown in FIG. 3, the latch enable circuitry 300 may be implemented with multiple logic devices that may be referred to as sub-divided circuit portions, components, or devices coupled together and arranged to have interdependent relationships.

The latch enable circuitry 300 may include a first logic device 310 (e.g., a NAND gate) coupled to a second logic device 312 (e.g., an inverter). The first logic device 310 (e.g., NAND gate) may be configured to receive a first input signal NDFTRAMBYP (i.e., Not Designed For Testing RAM BYPass signal) and a second input signal ECEN (i.e., Early Chip-ENable signal, or LATEN signal) and then provide an output signal to the second logic device 312 (i.e., inverter). The second logic device 312 (i.e., inverter) may be configured to receive the output signal from the first logic device 310 (i.e., NAND gate) and then provide an output signal ECENDFT (i.e., ECEN Designed For Testing).

The latch enable circuitry 300 may include a third logic device 314 (e.g., a NOR gate) coupled to a fourth logic device 316 (e.g., a NAND gate). The third logic device 314 (e.g., NOR gate) may be configured to receive the second input signal ECEN and a third input signal CEN (i.e., Chip-ENable signal) and then provide an output signal to the fourth logic device 316 (i.e., NAND gate). The fourth logic device 316 (i.e., NAND gate) may be configured to receive the first input signal NDFTRAMBYP and the output signal from the third logic device 314 (i.e., NOR gate) and then provide an output signal CENDFT.

The latch enable circuitry 300 may include a fifth logic device 320 (e.g., a NOR gate) coupled to a sixth logic device 322 (e.g., a NAND gate). The fifth logic device 320 (e.g., NOR gate) may be configured to receive output signal ECENDFT from the second logic device (i.e., inverter) and a fourth input signal GTP (i.e., Global Tracking Pulse) and then provide an output signal to the sixth logic device 322 (i.e., NAND gate). Further, the sixth logic device 322 (i.e., NAND gate) may be configured to receive the output signal from the fifth logic device 320 (i.e., NOR gate) and a fifth input signal NGTP (i.e., Not Global Tracking Pulse) and then provide an output signal BCLK (i.e., the second output clock signal BCLK, as described in reference to FIG. 2).

The latch enable circuitry 300 may include a seventh logic device 324 (e.g., a NAND gate) coupled to an eighth logic device 326 (e.g., an inverter). The seventh logic device 324 (e.g., NAND gate) may be configured to receive the fifth input signal NGTP and the output signal from the fifth logic device 320 (i.e., NOR gate) and then provide an output signal to the eighth logic device 326 (i.e., inverter). Further, the eighth logic device 326 (i.e., inverter) may be configured to receive the output signal from the seventh logic device 324 (i.e., NAND gate) and then provide an output signal NCLK (i.e., the first output clock signal NCLK, as described in reference to FIG. 2).

Implementation of latch enable circuitry 300 of FIG. 3 and ECEN functionality is provided in the subsequent Tables 1 and 2. As shown, ECEN may only be effective during Standby mode, and during Scan mode, ECEN may have no impact. In Tables 1 and 2 provided below, DFTRAMBYP refers to Designed For Testing RAM BYPass, and NDFTRAMBYP refers to the opposite polarity of DFTRAMBYP.

TABLE 1

ECEN Circuit Implementation

| DFTRAMBYP | ECEN | CEN | Memory Operation |
|---|---|---|---|
| 0 | 0 | 0 | Normal Read or Write |
| 0 | 1 | X | Standby (latches closed) |
| 0 | 0 | 1 | Standby (latches open) |
| 1 | X | X | Scan Mode |

TABLE 2

ECEN Modeling

| DFTRAMBYP | ECEN | CEN | Memory Operation |
|---|---|---|---|
| 0 | 0 | 0 | Normal Read or Write |
| 0 | 1 | 1 | Standby (latches closed) |
| 0 | 0 | 1 | Standby (latches open, WL-header enabled) |
| 0 | 1 | 0 | Illegal corrupt memory and outputs (Q and SO) Y not corrupted |
| 1 | X | X | Scan Mode |

Figure 4:
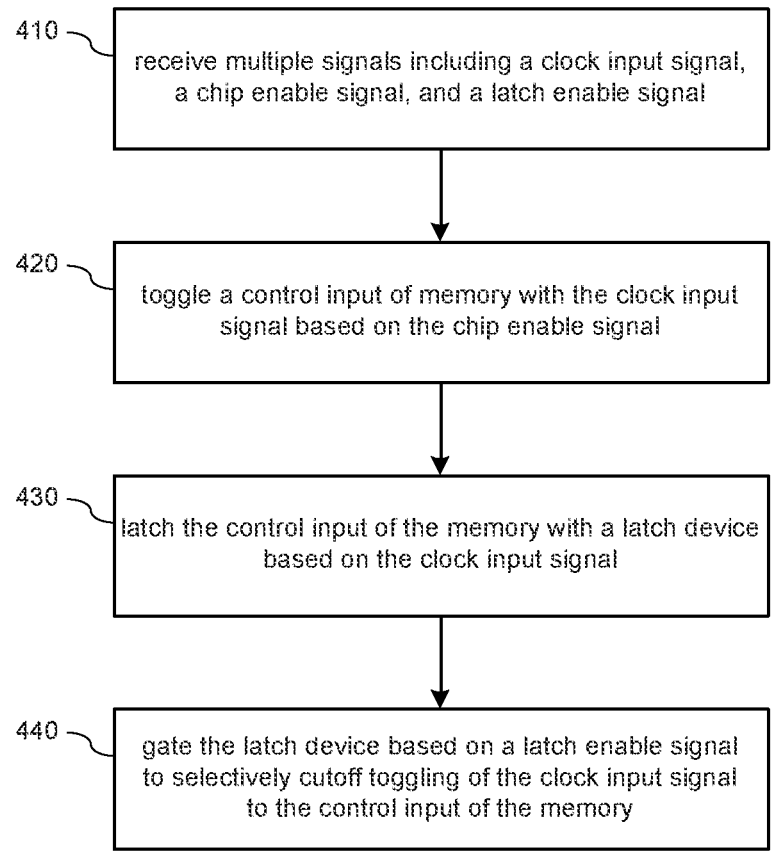
FIG. 4 illustrates a process diagram of a method for low power input gating in accordance with various implementations described herein.

FIG. 4 illustrates a process flow diagram of a method 400 for low power input gating in accordance with implementations described herein. It should be understood that even though method 400 indicates a particular order of execution of operations, in some instances, certain portions of the operations may be executed in a different order, and on different systems. In some other instances, additional operations or steps may be added to and/or omitted from method 400. In some implementations, computing device 500 of FIG. 5 may be configured to perform method 400. Further, in some implementations, method 400 may be implemented as a program or software instruction process configured for low power input gating to improve performance.

At block 410, method 400 may receive multiple signals including a clock input signal, a chip enable signal, and a latch enable signal. At block 420, method 400 may toggle a control input of memory with the clock input signal based on the chip enable signal. At block 430, method 400 may latch the control input of the memory with a latch device based on the clock input signal. At block 440, method 400 may gate the latch device based on a latch enable signal to selectively cutoff toggling of the clock input signal to the control input of the memory. In some instances, gating the latch device may include providing low power input gating to the latch device by using the latch enable signal to selectively cutoff toggling of the clock input signal to the control input of the memory.

Figure 5:
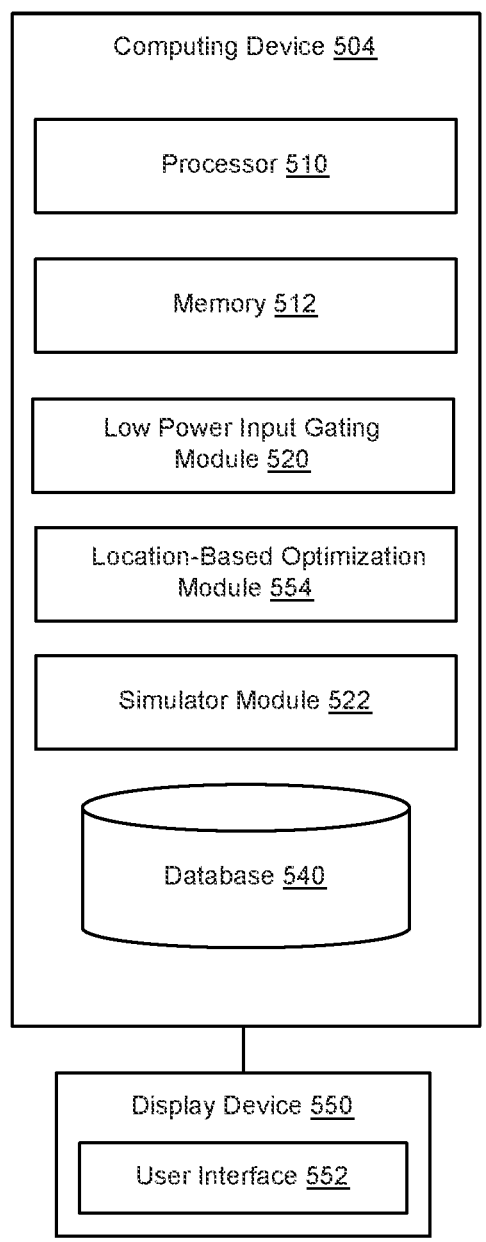
FIG. 5 illustrates a block diagram of a system for low power input gating and location-based optimization in accordance with various implementations described herein.

FIG. 5 illustrates a block diagram of a system 500 for low power input gating in accordance with various implementations described herein.

In reference to FIG. 5, the system 500 may include a computer based system configured for low power input gating. The system 500 may be associated with at least one computing device 504 that is implemented as a special purpose machine configured for low power input gating, as described herein. In some implementations, the computing device 504 may include any standard element(s) and/or component(s), including at least one processor(s) 510, memory 512 (e.g., non-transitory computer-readable storage medium, such as e.g., random access memory (RAM)), one or more database(s) 540, power, peripherals, and various other computing elements and/or components that may not be specifically shown in FIG. 5. Further, the computing device 504 may include instructions stored on the non-transitory computer-readable medium 512 that are executable by the processor 510. The computing device 504 may be associated with a display device 550 (e.g., monitor or other display) that may be used to provide a user interface (UI) 552, such as, e.g., a graphical user interface (GUI). The UI 552 may be used to receive various parameters and/or preferences from a user for managing, operating, and/or utilizing the computing device 504. As such, the computing device 504 may include display device 550 for providing output to a user, and display device 550 may include the UI 552 for receiving input from the user.

In various implementations, the computing device 504 may be configured to implement various methodologies for low power input gating. For instance, the computing device 504 may include a low power input gating module 520 configured to cause the at least one processor 510 to implement one or more or all techniques described in reference to FIGS. 1-4. The low power input gating module 520 may be implemented in hardware and/or software. If implemented in software, the low power input gating module 520 may be stored in memory 512 and/or database 540. If implemented in hardware, the low power input gating module 520 may be a separate processing component configured to interface with the at least one processor 510.

In various implementations, the low power input gating module 520 may be configured to cause the at least one processor 510 to perform various techniques, as described herein in reference to FIGS. 1-4. For instance, low power input gating module 520 may be configured to cause the at least one processor 510 to receive multiple signals including a clock input signal, a chip enable signal, and a latch enable signal. The low power input gating module 520 may be configured to cause the at least one processor 510 to toggle a control input of memory with the clock input signal based on the chip enable signal, latch the control input of the memory with a latch device based on the clock input signal, and gate the latch device (e.g., a low phase latch device) based on a latch enable signal to selectively cutoff toggling of the clock input signal to the control input of the memory. Further, as described herein, gating the latch device may provide low power input gating to the latch device by using the latch enable signal to selectively cutoff toggling of the clock input signal to the control input of the memory.

Further, in reference to FIG. 5, the computing device 504 may include a simulator module 522 configured to cause the at least one processor 510 to generate one or more simulations of the integrated circuit. The simulator module 522 may be referred to as a simulating component and may be implemented in hardware and/or software. If implemented in software, the simulator module 522 may be stored in memory 512 or database 540. If implemented in hardware, the simulator module 520 may be a separate processing component configured to interface with the processor 510.

In some instances, the simulator module 522 may include a SPICE simulator configured to generate SPICE simulations of the integrated circuit. Generally, SPICE refers to an acronym for Simulation Program with Integrated Circuit Emphasis, which is an open source analog electronic circuit simulator. Further, SPICE is a general-purpose software program used by the semiconductor industry to check the integrity of integrated circuit designs and to predict the behavior of integrated circuit designs. Thus, in some instances, the low power input gating module 520 may be configured to interface with the simulator module 522 to generate timing data related to operating conditions based on one or more simulations (including, e.g., SPICE simulations) of an integrated circuit that may be used for analyzing the integrated circuit. Further, the low power input gating module 520 may be configured to use the one or more simulations (including, e.g., SPICE simulations) of the integrated circuit for recommending changes for instances of the cells (e.g., various circuit devices, components, etc.) along circuit paths including critical paths.

In some implementations, the computing device 504 may include one or more databases 540 configured to store and/or record various information related to low power input gating. In various instances, the database(s) 540 may be configured to store and/or record information related to the integrated circuit, various operating conditions, and/or relevant timing data. Further, database(s) 540 may be configured to store and/or record information related to the integrated circuit and timing data in reference to simulation data (including, e.g., SPICE simulation data).

Figure 6:
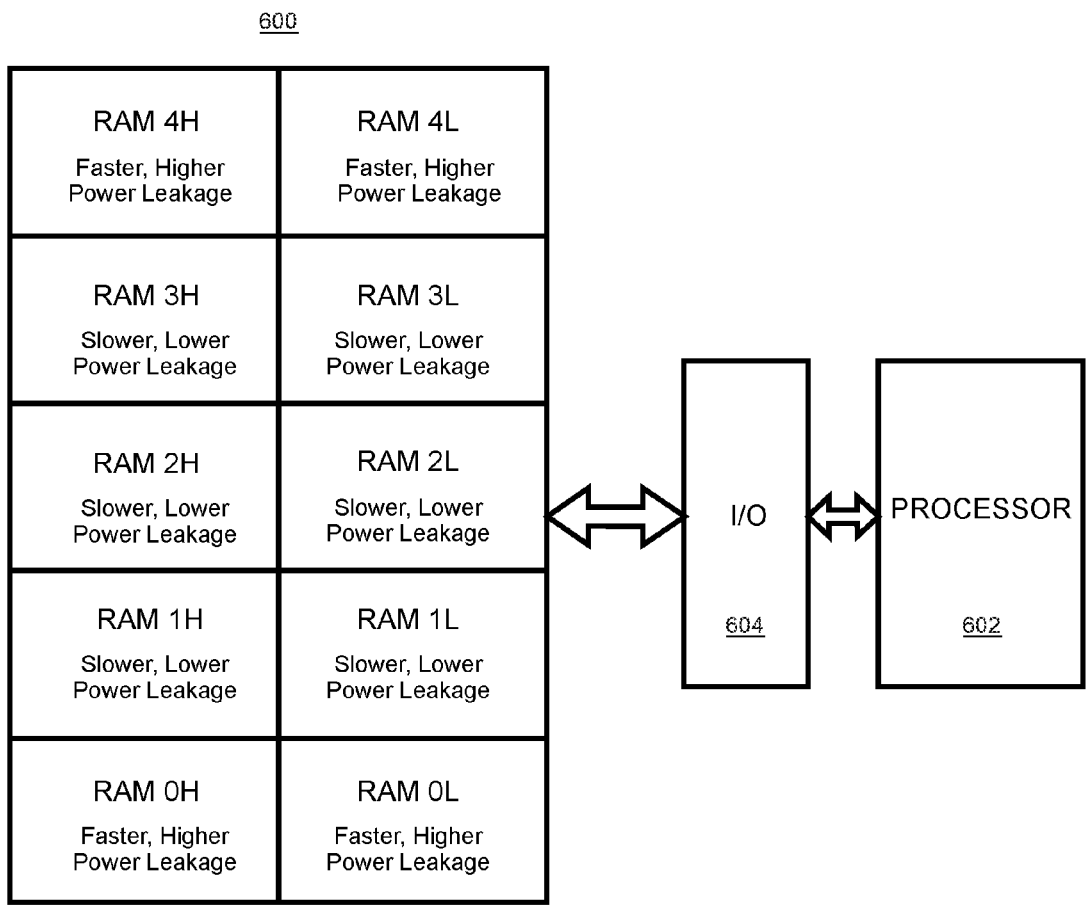
FIG. 6 illustrates a memory having a floorplan comprising memory blocks with location-based optimization in accordance with various implementations described herein.

For a memory having a floorplan comprising various memory blocks, methods are described by which instantiations (instances) of the various memory blocks are selected to satisfy timing specifications with the goal of minimizing (or approximately minimizing) power dissipation. FIG. 6 illustrates a RAM 600 comprising ten RAM blocks, labeled "RAM nL" or "RAM nH" where n is an integer from 0 to 4, "H" denotes higher order bits in a memory address, and "L" denotes lower order bits in a memory address. The RAM 600 is coupled to a processor 602 by way of an interface circuit 604, where a single address space can be used to address bit cells within the RAM blocks of the RAM 600. The interface circuit 604 may be a memory controller, for example, and may be embedded within the processor 602. The processor 602 may be a single-core or multi-core microprocessor, or it may be implemented as a plurality of processors in a SOC (System-On-Chip) application. The RAM 600 may be part of a memory hierarchy, and may represent, for example, system memory. Other embodiments may employ different kinds of memory other than RAM, such as SRAM, but for ease of discussion the memory illustrated in FIG. 6 and its associated description is within the context of a RAM.

For a given library of leaf cells, such as for example particular instantiations of bit cells and muxes (multiplexer/demultiplexer) for row and column address decoders, a memory compiler may generate different instantiations of a RAM block. For example, the bit cells in a particular RAM block instance may be tiled together such that the RAM block comprises one or more bits cell arrays. A bit cell array may be referred to as a bank. As another option, different instantiations of bit cells may be selected to trade off power consumption (or leakage) with timing. For example, different transistor threshold voltages may be available depending upon the process technology, as well as different circuit architectures such as transistor size or forward body bias implementations.

In describing various embodiments, it may be convenient at times to refer to a RAM block or an instantiation of a RAM block (or a RAM block instance). For a RAM block, reference is being made to some particular partition within the memory. That is, bits within a particular RAM block are addressed by some subset of the address space of the memory. An instantiation of a RAM block (or a RAM block instance) is some particular circuit synthesis of the RAM block. For example, referring to FIG. 6, the memory 600 has a floorplan comprising ten RAM blocks. RAM block 0L refers to a particular partition within the floorplan of the memory 600, where RAM block 0H refers to another particular partition. A memory compiler may be used to design many instantiations of the RAM block 0L, and similarly for the RAM block 0H. More generally, the terms memory block and memory block instances can be used, but for ease of discussion the description of the embodiments is within the context of a RAM.

Location-based optimization is a term used herein to refer to methods of designing particular instantiations of the RAM blocks in a memory to reduce power consumption (or not to significantly increase power consumption or leakage) while maintaining timing specifications. It should be understood that it is not necessary that an actual optimization be carried out. That is, final selection or design of the instantiations of the RAM blocks need not be the optimum or best instantiations among all possible memory instances in terms of minimizing power (or not significantly increasing power consumption or leakage), but rather relatively low power consumption or dissipation for the particular timing specifications may achieved. This "optimization" can be made separately for each RAM block, so that adjacent RAM blocks within a memory may have different types of bit cells, muxes, or architecture, that is, different instantiations. Designing an instantiation for each RAM block, where each RAM block occupies a particular location with the memory floorplan, motivates the terminology of referring to the optimization as "location-based."

Location-based optimization provides flexibility in selecting instantiations for RAM blocks based upon relative position within a memory system. In the particular example of FIG. 6, if all RAM blocks had the same speed, then RAM blocks RAM 0H, RAM 0L, RAM 4H, and RAM 4L would exhibit the worst-case timing because of their relative large distances from the interface circuit 604. However, with location-based optimization, a trade-off can be made whereby faster instantiations (at the expense of higher leakage current) are chosen for RAM blocks RAM 0H, RAM 0L, RAM 4H, and RAM 4L compared to slower instantiations (but with lower leakage current) for the remaining RAM blocks. With proper selection of the instantiations it may be possible for the memory 600 to satisfy timing requirements while minimizing leakage current.

A module for performing location-based optimization is illustrated within the computing device 500 of FIG. 5 as a location-based optimization module 554. The location base optimization module 554 may comprise one or more processes running on the processor 510 when executing instructions stored in the memory 512. Although the computing device 500 illustrates both the low power input gating module 520 and the location-based optimization module 554, some embodiments may include one of either module without the other, whereas other embodiments may include both modules.

Figure 7:
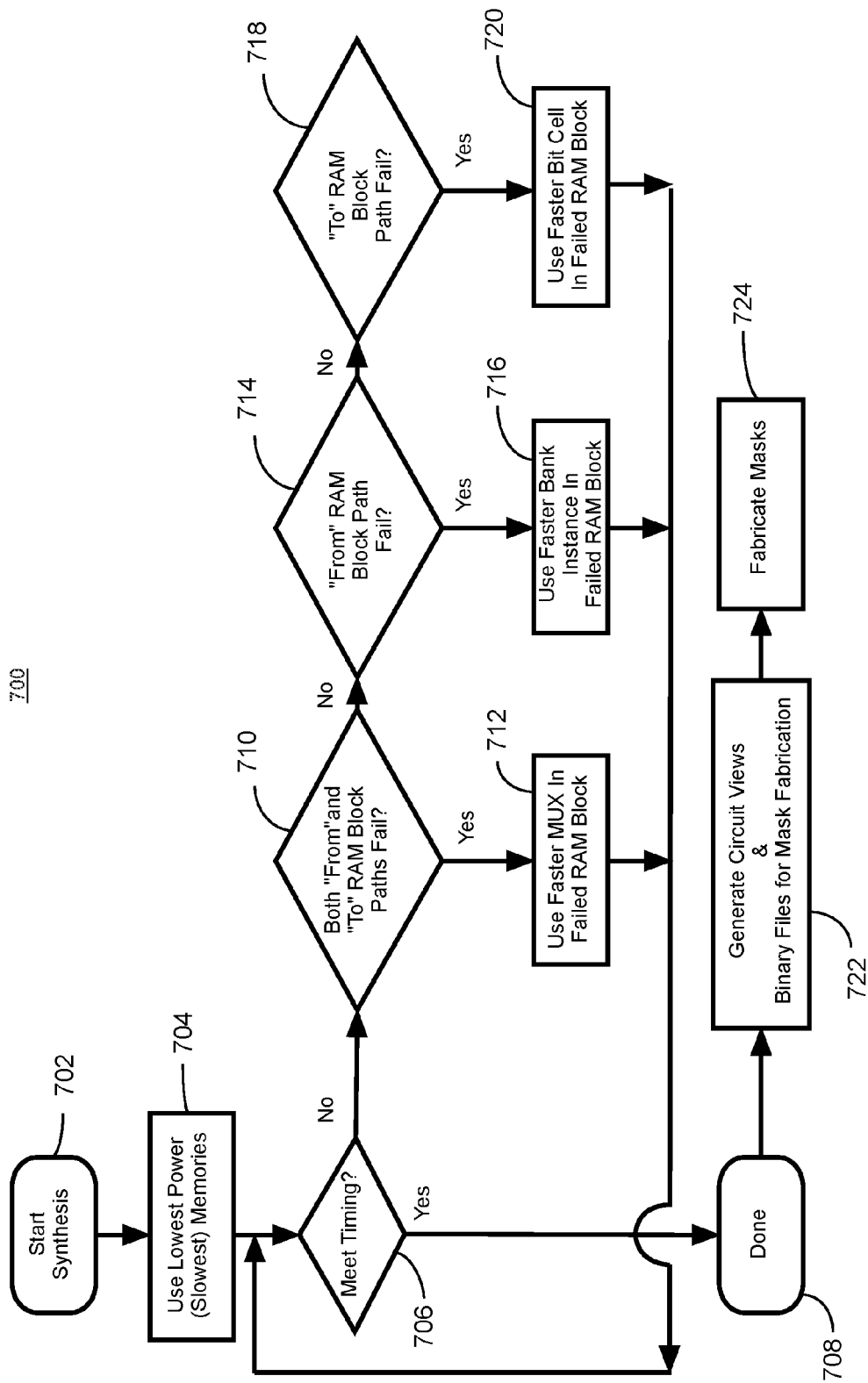
FIG. 7 illustrates a method of location-based optimization in accordance with various implementations described herein.

FIG. 7 illustrates a method 700 according to an embodiment for location-based optimization. One or more processes running on the processor 510 may perform the method 700. A goal of the method 700 is to achieve the timing specifications with minimum (or approximately minimum) power consumption, so that when first starting the synthesis of a memory instance (702), the method 700 begins in step 704 with the slowest memories for the RAM blocks. A simulation is performed to determine if the memory instance meets the timing specifications, and if in step 706 it is determined that the timing specifications are satisfied, then the method 700 ends as indicated in step 708.

If, however, step 706 determines that the timing specifications are not met, then in step 710 a determination is made as to whether signal paths to and from some particular RAM block each fail to satisfy the timing specifications. (Signal path timing may be referenced to the interface circuit 604.) If the timing specifications are not satisfied, then in step 712 a faster mux instance is used, resulting in a modified instantiation of the RAM block (i.e., a modified RAM block instance). The timing for the modified memory instance is tested in step 706, where if the timing specifications are satisfied the method ends as indicated in step 708. If step 706 determines that the timing specifications are still not satisfied, then step 710 is repeated for some other RAM block. If both signal paths to and from the selected RAM block each fail to meet the timing specifications, then a faster mux instance is replaced for the RAM block under consideration, resulting in another instantiation, and the timing is again tested in step 706.

When considering the loop comprising step 710, 712, and 706, eventually either at least one signal path satisfies the timing specifications, or a sufficiently large number of iterations will have been performed so that the run time or number of processing cycles of the method 700 exceeds some specified threshold, in which case the method 700 stops. (For ease of illustration the latter case is not shown in FIG. 7.) Therefore, to describe the other steps in the method 700, consider the case in which step 710 determines that at least one of the signal paths satisfies the timing specifications.

Step 714 determines whether the signal path from the particular RAM block under consideration (i.e., the RAM block for which the result of step 710 is "No") fails to meet the timing specifications. If the "from" signal path fails the timing specifications, then in step 716 a faster bank instance is used for the RAM block, and timing for the modified memory instance is tested in step 706. If the timing specifications are satisfied, the method 700 ends as indicated in step 708. If, however, the timing specifications are not met, step 710 is performed for another RAM block.

If step 714 determines that the signal path from the RAM block under consideration meets the timing specifications, then in step 720 faster bit cells are used in the RAM block resulting in a modified RAM block instance. The modified memory instance is tested in step 706, where again the method 700 stops if the timing specifications are met, but step 710 is performed for another RAM block if the memory instance fails the timing specifications.

FIG. 7 explicitly shows step 718 indicating that a determination is made as to whether the signal path to the RAM block has met the timing specifications. Because the RAM block under consideration is such that both determinations made in steps 710 and 714 yield a "No," it follows that the signal path to the RAM block under consideration must fail the timing specifications, in which case step 718 as illustrated in FIG. 7 appears to be superfluous. However, explicitly showing step 718 aides in the description of the embodiments because the relative ordering of steps 714 and 718 as shown in FIG. 7 may be reversed. That is, in some embodiments the order of steps 714 and 718 can be changed so that if step 710 determines that at least one of the signal paths meets the timing specifications, then the next step after step 710 could be step 718. For such embodiments, the sequence of steps 718 and 720 would then be illustrated to the left of the sequence of steps 714 and 716.

As discussed with respect to the loop comprising step 710, 712, and 706, various other loops exist in the flow diagram illustrated in FIG. 7, and embodiments may set a threshold for the number of processing cycles or the duration time when running the method 700 so that when such a threshold is exceeded, the method 700 stops.

The method 700 is a component of a design and manufacturing methodology whereby various circuit views and files are generated for a memory and other integrated circuits, resulting in one or more binary files for mask fabrication, as indicated by step 722, with eventual fabrication of one or more masks for a semiconductor foundry as indicated in step 724.

Figure 8:
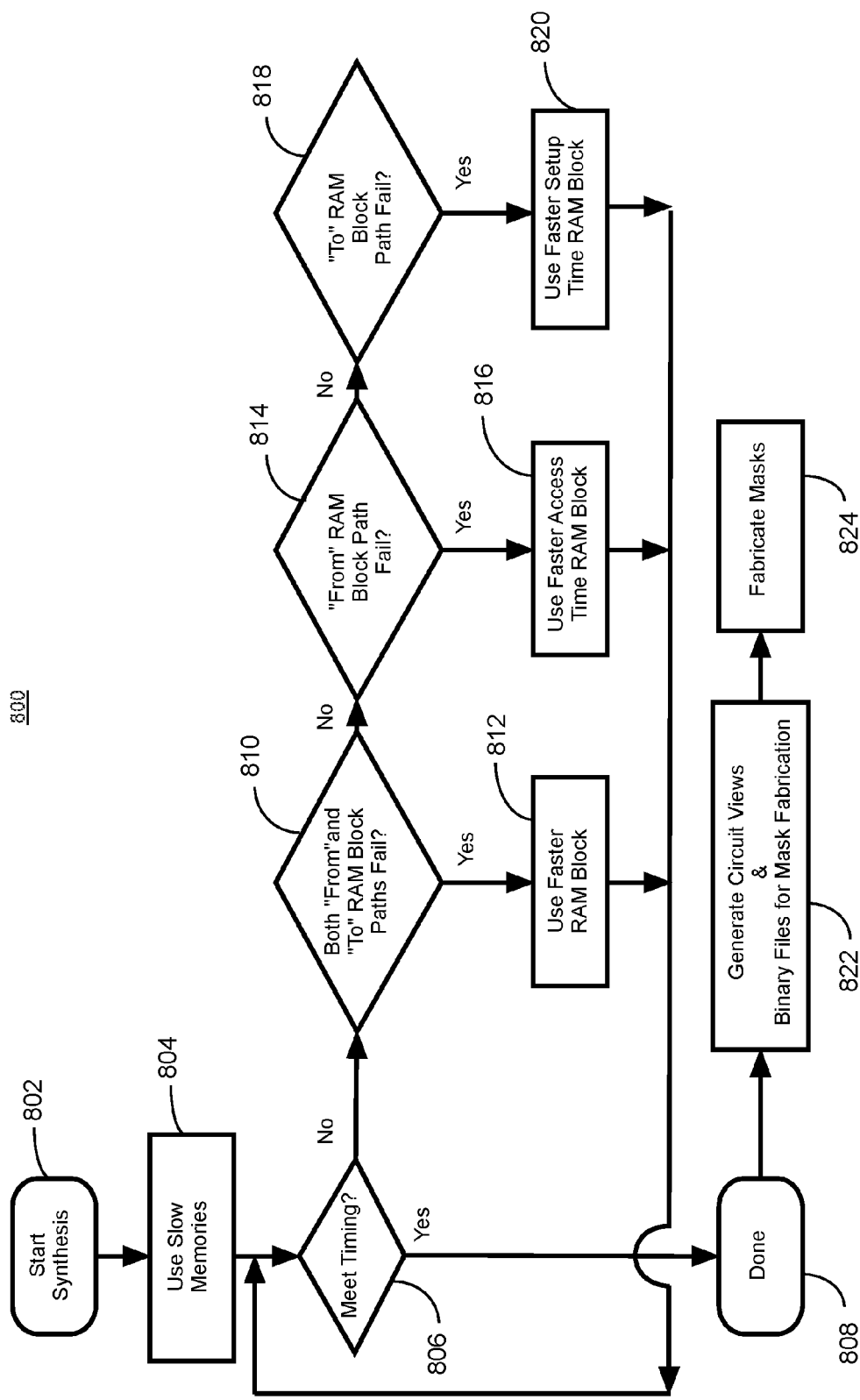
FIG. 8 illustrates another method of location-based optimization in accordance with various implementations described herein

FIG. 8 illustrates a method 800 for designing the floorplan of a memory according to another embodiment. Although the flow diagram structure of FIG. 8 is the same as that of FIG. 7, once synthesis (802) is started, the method 800 begins in step 804 using slow RAM blocks. By "slow" RAM blocks or memories, it is meant that if the RAM blocks can be binned in speed from slowest to fastest, then the method 800 begins with RAM blocks having the slowest speed. The method of FIG. 8 may be suitable for which relatively high performance is desired without significantly increasing leakage current.

Step 806 determines whether the memory instance satisfies the timing specifications, and if the memory instance does meet the timing specifications, then the method 800 ends as indicated in step 808. As in FIG. 7, if the result of step 806 is that the timing specifications are not met, then in step 810 a determination is made as to whether the signal paths to and from a RAM block each fail the timing specifications. If both signal paths fail the timing specifications, then in step 812 a faster instantiation of the particular RAM block under consideration is selected, and the modified memory instance is tested in step 806 to determine whether the timing specifications are satisfied. As in FIG. 7, if the timing specifications are satisfied, then the method 800 stops as indicated in step 808.

If, however, in step 810 it is determined that at least one of the signal paths to or from the RAM block satisfies the timing specifications, then in step 814 a determination is made as to whether the signal path from the RAM block meets the timing specifications. If the "from" signal path fails to meet the timing specifications, then in step 816 a faster access time instantiation of the RAM block is selected and the modified memory instance is tested in step 806 to determine whether the timing specifications are satisfied. If the timing specifications are satisfied, then the method 800 stops as indicated in step 808; but if the timing specifications are not met, then another RAM block is selected and a determination in step 810 is made as to whether the signal paths to and from the selected RAM block under consideration each fail to meet the timing specifications. For the currently selected RAM block under consideration, steps 814 and 816 are performed as discussed previously.

If, however, in step 814 it is determined that the "from" path meets the timing specifications, then in step 820 an instantiation of the RAM block is selected that has a faster setup time. The modified memory instance is then tested in step 806 to determine whether the timing specifications are met, and the method 800 continues as discussed previously.

As it was not necessary to explicitly illustrate step 718 in FIG. 7, step 818 in FIG. 8 also appears to be superfluous, but for the same reasons as discussed previously with respect to FIG. 7, it is pedagogically useful to illustrate step 818 because for some embodiments the order of steps 814 and 818 may be changed so that the sequence of steps 818 and 820 appears to the left of the sequence of steps 814 and 816.

If more than two instantiations of a RAM block are available, one instantiation having a higher level of speed than the other, then the sequence of steps 810 and 812 may be performed more than once for the same RAM block. Similar statements apply to the sequence of steps 814 and 816, as well as to the sequence of steps 818 and 820, where if more than two access times or more than two setup times are available for the same RAM block, then these two sequences may be performed more than once for the same RAM block.

As discussed with respect to FIG. 7, various loops exist in the flow diagram illustrated in FIG. 8, and a threshold may be set for the number of processing cycles or the duration time when running the method 800 so that when such a threshold is exceeded, the method 800 stops.

As for the method 700, the method 800 is a component of a design and manufacturing methodology whereby various circuit views and files are generated for a memory and other integrated circuits, resulting in one or more binary files for mask fabrication, as indicated by step 822, with eventual fabrication of one or more masks for a semiconductor foundry as indicated in step 824.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of an integrated circuit. The integrated circuit may include a chip enable device configured to receive and use a clock input signal to toggle a control input of memory based on a chip enable signal. The integrated circuit may include a latch device configured to latch the control input of the memory. The integrated circuit may include a latch enable device coupled between the chip enable device and the latch device. The latch enable device may be configured to receive the clock input signal from the chip enable device and use the clock input signal to gate the latch device based on a latch enable signal so as to selectively cutoff toggling of the clock input signal to the control input of the memory.

Described herein are various implementations of an integrated circuit. The integrated circuit may include a first logic device configured to receive a clock input signal, receive a latch enable signal, and provide a first output clock signal. The integrated circuit may include a second logic device configured to receive the first output clock signal and provide a second output clock signal that is a compliment of the first clock input signal. The integrated circuit may include a latch device configured to latch a control input of memory based on the first clock output signal, the second clock output signal, and the latch enable signal. Further, the first and second logic devices may be configured to use the clock input signal to gate the latch device based on the latch enable signal so as to selectively cutoff the clock input signal to the control input of the memory.

Described herein are various implementations of a method. The method may include receiving multiple signals including a clock input signal, a chip enable signal, and a latch enable signal. The method may include toggling a control input of memory with the clock input signal based on the chip enable signal. The method may include latching the control input of the memory with a latch device based on the clock input signal. The method may include gating the latch device based on a latch enable signal to selectively cutoff toggling of the clock input signal to the control input of the memory.

Described herein are various implementations of a method to fabricate a circuit for a memory having a set of memory blocks. The method may include generating a first instantiation for each memory block in the memory; and provided the first instantiation of a first memory block fails timing specifications for a signal path to the first memory block and a signal path from the first memory block, replacing mux instances in the first instantiation of the first memory block with faster mux instances to generate a second instantiation of the first memory block.

Described herein are various implementations of another method to fabricate a circuit for a memory having a set of memory blocks. The method may include generating a first instantiation for each memory block; and provided the first instantiation of a first memory block fails timing specifications for a signal path to the first memory block and a signal path from the first memory block, generating a second instantiation of the first memory block with faster speed than that of the first instantiation of the first memory block.

Described herein are various implementations of an apparatus to fabricate a circuit for a memory having a set of memory blocks. The apparatus may include a memory to store instructions; and a processor coupled to the memory. The processor when executing the stored instructions performs a method that may include generating a first instantiation for each memory block, and provided the first instantiation of a first memory block fails timing specifications for a signal path to the first memory block and a signal path from the first memory block, replacing mux instances in the first instantiation of the first memory block with faster mux instances to generate a second instantiation of the first memory block, or generating a second instantiation of the first memory block with faster speed than that of the first instantiation of the first memory block.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method to fabricate a circuit for a memory having a set of memory blocks, the method comprising:
    generating a first instantiation for each memory block;
    provided the first instantiation of a first memory block fails timing specifications for a signal path to the first memory block and a signal path from the first memory block, replacing mux instances in the first instantiation of the first memory block with faster mux instances to generate a second instantiation of the first memory block;
    generating an instantiation of the memory based upon the second instantiation of the first memory block and the first instantiation of each memory block other than the first memory block; and
    provided the instantiation of the memory fails timing specifications, testing time specifications for the first instantiation of a second memory block.

2. The method as set forth in claim 1, further comprising:
    provided the first instantiation of the second memory block fails timing specifications for a signal path to the second memory block and a signal path from the second memory block, replacing mux instances in the first instantiation of the second memory block with faster mux instances to generate a second instantiation of the second memory block.

3. A method to fabricate a circuit for a memory having a set of memory blocks, the method comprising:
    generating a first instantiation for each memory block;
    provided the first instantiation of a first memory block fails timing specifications for a signal path to the first memory block and a signal path from the first memory block, replacing mux instances in the first instantiation of the first memory block with faster mux instances to generate a second instantiation of the first memory block; and
    provided the first instantiation of a first memory block fails timing specifications for a signal path from the first memory block but passes timing specifications for a signal path to the first memory block, generating a second instantiation of the first memory block with a faster bank instance than that of the first instantiation of the first memory block.

4. The method as set forth in claim 3, further comprising:
generating an instantiation of the memory based upon the second instantiation of the first memory block and the first instantiation of each memory block other than the first memory block;
provided the instantiation of the memory fails timing specifications, testing time specifications for the first instantiation of a second memory block; and
provided the first instantiation of the second memory block fails timing specifications for a signal path to the second memory block and a signal path from the second memory block, replacing mux instances in the first instantiation of the second memory block with faster mux instances to generate a second instantiation of the second memory block.

5. A method to fabricate a circuit for a memory having a set of memory blocks, the method comprising:
generating a first instantiation for each memory block;
provided the first instantiation of a first memory block fails timing specifications for a signal path to the first memory block and a signal path from the first memory block, replacing mux instances in the first instantiation of the first memory block with faster mux instances to generate a second instantiation of the first memory block; and
provided the first instantiation of a first memory block fails timing specifications for a signal path to the first memory block but passes timing specifications for a signal path from the first memory block, generating a second instantiation of the first memory block with faster bit cell instances than that of the first instantiation of the first memory block.

6. The method as set forth in claim 5, further comprising:
generating an instantiation of the memory based upon the second instantiation of the first memory block and the first instantiation of each memory block other than the first memory block;
provided the instantiation of the memory fails timing specifications, testing time specifications for the first instantiation of a second memory block; and
provided the first instantiation of the second memory block fails timing specifications for a signal path to the second memory block and a signal path from the second memory block, replacing mux instances in the first instantiation of the second memory block with faster mux instances to generate a second instantiation of the second memory block.

7. A method to fabricate a circuit for a memory having a set of memory blocks, the method comprising:
generating a first instantiation for each memory block;
provided the first instantiation of a first memory block fails timing specifications for a signal path to the first memory block and a signal path from the first memory block, replacing mux instances in the first instantiation of the first memory block with faster mux instances to generate a second instantiation of the first memory block;
generating one or more files for mask generation based at least in part on the instantiation of the memory; and
fabricating at least one mask based upon the one or more files.

8. A method to fabricate a circuit for a memory having a set of memory blocks, the method comprising:
generating a first instantiation for each memory block;
provided the first instantiation of a first memory block fails timing specifications for a signal path to the first memory block and a signal path from the first memory block, generating a second instantiation of the first memory block with faster speed than that of the first instantiation of the first memory block;
generating an instantiation of the memory based upon the second instantiation of the first memory block and the first instantiation of each memory block other than the first memory block; and
provided the instantiation of the memory fails timing specifications, testing time specifications for the first instantiation of a second memory block.

9. The method as set forth in claim 8, further comprising:
provided the first instantiation of the second memory block fails timing specifications for a signal path to the second memory block and a signal path from the second memory block, generating a second instantiation of the second memory block with faster speed than that of the first instantiation of the second memory block.

10. A method to fabricate a circuit for a memory having a set of memory blocks, the method comprising:
generating a first instantiation for each memory block;
provided the first instantiation of a first memory block fails timing specifications for a signal path to the first memory block and a signal path from the first memory block, generating a second instantiation of the first memory block with faster speed than that of the first instantiation of the first memory block; and
provided the first instantiation of a first memory block fails timing specifications for a signal path from the first memory block but passes timing specifications for a signal path to the first memory block, generating a second instantiation of the first memory block with faster access time than that of the first instantiation of the first memory block.

11. The method as set forth in claim 10, further comprising:
generating an instantiation of the memory based upon the second instantiation of the first memory block and the first instantiation of each memory block other than the first memory block;
provided the instantiation of the memory fails timing specifications, testing time specifications for the first instantiation of a second memory block; and
provided the first instantiation of the second memory block fails timing specifications for a signal path to the second memory block and a signal path from the second memory block, generating a second instantiation of the second memory block with faster speed than that of the second instantiation of the first memory block.

12. A method as set forth in claim 8, further-to fabricate a circuit for a memory having a set of memory blocks, the method comprising:
generating a first instantiation for each memory block;
provided the first instantiation of a first memory block fails timing specifications for a signal path to the first memory block and a signal path from the first memory block, generating a second instantiation of the first memory block with faster speed than that of the first instantiation of the first memory block; and
provided the first instantiation of a first memory block fails timing specifications for a signal path to the first memory block but passes timing specifications for a signal path from the first memory block, generating a second instantiation of the first memory block with a faster setup time than that of the first instantiation of the first memory block.

13. The method as set forth in claim 12, further comprising:
   generating an instantiation of the memory based upon the second instantiation of the first memory block and the first instantiation of each memory block other than the first memory block;
   provided the instantiation of the memory fails timing specifications, testing time specifications for the first instantiation of a second memory block; and
   provided the first instantiation of the second memory block fails timing specifications for a signal path to the second memory block and a signal path from the second memory block, generating a second instantiation of the second memory block with faster speed than that of the first instantiation of the second memory block.

14. A method to fabricate a circuit for a memory having a set of memory blocks, the method comprising:
   generating a first instantiation for each memory block;
   provided the first instantiation of a first memory block fails timing specifications for a signal path to the first memory block and a signal path from the first memory block, generating a second instantiation of the first memory block with faster speed than that of the first instantiation of the first memory block; and
   generating one or more files for mask generation based at least in part upon the instantiation of the memory; and
   fabricating at least one mask based upon the one or more files.

15. An apparatus to fabricate a circuit for a memory having a set of memory blocks, comprising:
   a memory to store instructions; and
   a processor coupled to the memory that when executing the stored instructions performs a method comprising:
      generating a first instantiation for each memory block;
      provided the first instantiation of a first memory block fails timing specifications for a signal path to the first memory block and a signal path from the first memory block, replacing mux instances in the first instantiation of the first memory block with faster mux instances to generate a second instantiation of the first memory block, or generating a second instantiation of the first memory block with faster speed than that of the first instantiation of the first memory block;
      generating an instantiation of the memory based upon the second instantiation of the first memory block and the first instantiation of each memory block other than the first memory block; and
      provided the instantiation of the memory fails timing specifications, testing time specifications for the first instantiation of a second memory block.

16. The apparatus as set forth in claim 15, the method further comprising:
   provided the first instantiation of the second memory block fails timing specifications for a signal path to the second memory block and a signal path from the second memory block, replacing mux instances in the first instantiation of the second memory block with faster mux instances to generate a second instantiation of the second memory block or generating a second instantiation of the second memory block with faster speed than that of the first instantiation of the second memory block.

17. An apparatus to fabricate a circuit for a memory having a set of memory blocks, comprising:
   a memory to store instructions; and
   a processor coupled to the memory that when executing the stored instructions performs a method comprising:
      generating a first instantiation for each memory block;
      provided the first instantiation of a first memory block fails timing specifications for a signal path to the first memory block and a signal path from the first memory block, replacing mux instances in the first instantiation of the first memory block with faster mux instances to generate a second instantiation of the first memory block, or generating a second instantiation of the first memory block with faster speed than that of the first instantiation of the first memory block;
      provided the first instantiation of a first memory block fails timing specifications for a signal path from the first memory block but passes timing specifications for a signal path to the first memory block, generating a second instantiation of the first memory block with a faster bank than that of the first instantiation of the first memory block or generating a second instantiation of the first memory block with faster access time than that of the first instantiation of the first memory block; and
      provided the first instantiation of a first memory block fails timing specifications for a signal path to the first memory block but passes timing specifications for a signal path from the first memory block, generating a second instantiation of the first memory block with faster bit cell instances than that of the first instantiation of the first memory block or generating a second instantiation of the first memory block with a faster setup time than that of the first instantiation of the first memory block.

* * * * *